US006774621B2

(12) United States Patent
Takekoshi

(10) Patent No.: US 6,774,621 B2
(45) Date of Patent: *Aug. 10, 2004

(54) INSPECTION STAGE HAVING A PLURALITY OF Z AXES

(75) Inventor: Kiyoshi Takekoshi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/437,065

(22) Filed: May 14, 2003

(65) Prior Publication Data

US 2003/0201765 A1 Oct. 30, 2003

Related U.S. Application Data

(63) Continuation-in-part of application No. 09/880,117, filed on Jun. 14, 2001, now Pat. No. 6,583,614.

(30) Foreign Application Priority Data

Jun. 15, 2000 (JP) ....................................... 2000-180206

(51) Int. Cl.[7] ................................................ G01R 1/04
(52) U.S. Cl. .................................... 324/158.1; 324/758
(58) Field of Search .............................. 324/758, 158.1, 324/755, 765, 73.1; 33/533

(56) References Cited

U.S. PATENT DOCUMENTS

| 4,751,457 A | 6/1988 | Veenendaal |
| 5,410,259 A | 4/1995 | Fujihara et al. |
| 5,642,056 A | 6/1997 | Nakajima et al. |
| 5,804,983 A | 9/1998 | Nakajima et al. |
| 5,828,225 A | 10/1998 | Obikane et al. |
| 6,140,828 A | 10/2000 | Iino et al. |
| 6,583,614 B2 * | 6/2003 | Takekoshi ................ 324/158.1 |

FOREIGN PATENT DOCUMENTS

| JP | 4-207047 | 7/1992 |
| JP | 5-144892 | 6/1993 |
| JP | 2001-358204 | 12/2001 |

* cited by examiner

*Primary Examiner*—Vinh P. Nguyen
(74) *Attorney, Agent, or Firm*—Oblon, Spivak, McClelland, Maier & Neustadt, P.C.

(57) ABSTRACT

An inspection stage including a chuck top, a rectangular Z base, an X stage, a Y stage, and a Z axis elevating mechanism. The chuck top is used for mounting a wafer W. The Z base is provided with the chuck top and is vertically movable. The X stage elevatingly supports the Z base and is movable in an X direction. The Y stage movably supports the X stage in the X direction and is movable in a Y direction. The Z axis elevating mechanism is provided at each of the four corners of the Z base in such a manner as to surround the chuck top.

7 Claims, 5 Drawing Sheets

INSPECTION STAGE HAVING A PLURALITY OF Z AXES

CROSS-REFERENCE TO RELATED APPLICATIONS

This is a Continuation-in-Part application of U.S. patent application Ser. No. 09/880,117, filed Jun. 14, 2001, now U.S. Pat. No. 6,583,614 the entire contents of which are incorporated herein by reference.

This application is based upon and claims the benefit of priority from the prior Japanese Patent Application No. 2000-180206, filed Jun. 15, 2000, the entire contents of which are incorporated herein by reference.

BACKGROUND OF THE INVENTION

1. Field of the Invention

The present invention relates to an inspection stage. More specifically, the present invention relates to an inspection stage upon which a work to be tested can be inspected with high reliability and which provides a space-saving feature as the application of an unbalanced load to a chuck top during inspection hardly inclines the chuck top.

2. Description of the Related Art

Conventionally, a wafer prober is widely used for inspecting a work to be tested such as an integrated circuit formed on a semiconductor wafer. For ease of explanation, the following description deals with the case where the work to be tested is an integrated circuit (hereafter referred to as the IC chip) formed on a semiconductor wafer (hereafter referred to as the wafer). The wafer prober comprises a loader chamber and a prober chamber. The loader chamber transports the semiconductor wafer and prealigns it. The prober chamber inspects electric characteristics of the wafer transported from the loader chamber. The prober chamber is provided with an inspection stage which holds the wafer and is movable in X, Y, and Z directions. Above the inspection stage, there is provided a probe card having a plurality of probes. Moving the inspection stage aligns the IC chip formed on the wafer to a plurality of probes of the probe card. Then, the inspection stage is raised to electrically contact the IC chip's electrodes with the probes. In this state, the electrical characteristics of the IC chip are inspected.

In recent years, however, IC chip integration is rapidly increasing, drastically increasing the number of electrode pads for IC chips and therefore narrowing the pitches in an array of electrode pads.

This increases the number of IC chips measured by a single operation (same measurement count) and the number of probes on a probe card. During inspection, a needle load applied to the chuck top via the probe increases to several tens to 200 kg. When an IC chip formed on the periphery of a wafer is inspected, an unbalanced load of several tens to 200 kg is applied to the wafer. The unbalanced load slants the chuck top. This slant makes it difficult to let each electrode pad of the IC chip evenly contact the probe card, degrading the inspection reliability.

In Jpn. Pat. Appln. No. 11-64997, we proposed an inspection stage and an inspection apparatus which hardly inclines a chuck top, even under a large needle load. As shown in FIG. 5, the inspection stage comprises a chuck top 1, a Z base 2, an X stage 3, and a Y stage 4. A wafer is placed on the chuck top 1. The chuck top 1 is mounted on the approximately triangular Z base 2 which can move up and down. The X stage 3 holds the Z base 2 by allowing vertical movement and moves in the X direction. The Y stage 4 holds the X stage 3 by allowing movement in the X direction and moves in the Y direction. The Z base 2 is provided with three elevating mechanisms arranged so that they surround the chuck top 1. The elevating mechanisms 5 move the Z base 2 horizontally.

When an unbalanced load is applied to a wafer placed on the chuck top 1 during inspection, the inspection stage disperses the unbalanced load into the elevating mechanisms 5. Consequently, an inclination of the chuck top 1 is decreased drastically.

When the diameter of the wafer diameter exceeds 300 mm, however, the chuck top 1 on the inspection stage also becomes larger. For example, FIG. 6A shows the chuck top 1 corresponding to a wafer measuring 200 mm in diameter. FIG. 6B shows this chuck top 1 is changed to a diameter for wafers measuring 300 mm or more in diameter. As seen from this figure, the shaded edge portions protrude from the area formed by the central region between each of the elevating mechanisms 5. When a portion of an IC chip in the shaded portion is inspected, a needle load is applied to the shaded portion, slightly depressing this portion. By contrast, the opposite side to this shaded portion rises. As a result, the chuck top 1 slants, causing the problem of the conventional inspection stage.

To prevent the chuck top 1 from slanting, the Z base 2 needs to be made larger, as shown in FIG. 7 so that a large-diameter chuck top 1 fits in the Z base 2. The X stage 3 and the Y stage 4 also need to be enlarged.

BRIEF SUMMARY OF THE INVENTION

The present invention has been made in consideration of the foregoing. It is therefore an object of the present invention to provide an inspection stage which need not be enlarged if a work to be tested is enlarged.

Another object of the present invention to provide an inspection stage which prevents a chuck top from slanting remarkably if a work to be tested is enlarged.

Still another object of the present invention to provide an inspection stage which can ensure inspection reliability if a work to be tested is enlarged.

According to the first aspect of the present invention, there is provided an inspection stage comprising: a chuck top on which a work to be tested is mounted; a vertically movable support for supporting the chuck top; a support elevating mechanism having four or more Z axes for supporting the support and four or more Z axis elevating mechanisms for elevating each Z axis; an X stage capable of movement in an X direction for mounting the support elevating mechanism; and a Y stage capable of movement in a Y direction for mounting the X stage.

In the inspection stage, the support is preferably rectangular.

In the inspection stage, the four or more Z axis elevating mechanisms are preferably positioned so that a work to be tested mounted on the chuck top is arranged inside the region between these mechanisms.

In the inspection stage, the support elevating mechanism preferably further comprises an elevating position controller for adjusting vertical positions of each Z axis.

In the inspection stage, the elevating position controller preferably further comprises: a slant detection mechanism for detecting the horizontality of the support; and a slant controller for adjusting vertical positions of each Z axis and controlling the horizontality of the support within a specified range based on levelness of the support detected by the detection mechanism.

This inspection stage preferably further comprises a Z axis guide mechanism mounted on a bottom face of a support for guiding vertical movement of the support in a Z direction.

In the inspection stage, the Z axis guide mechanism preferably comprises a cylinder provided on one of the support and the X stage; and a column provided in the other of the support and the stage and reciprocatively fit in the cylinder.

In the inspection stage, the Z axis guide mechanism preferably comprises: a column provided on the support; and a cylinder provided on the X stage, wherein the cylinder fits to the column in a vertically movable state; and the X stage has an opening for the column to bore when the column moves vertically.

Other objects and advantages of the present invention will become apparent from the specification to follow. Parts thereof will be obvious from the disclosure or will become obvious by implementing the present invention. The objects and advantages of the present invention will be achieved and obtained by means and combinations particularly pointed out hereinafter.

BRIEF DESCRIPTION OF THE SEVERAL VIEWS OF THE DRAWING

For full understanding of the drawings used in the detailed description of the present invention, a brief description of each drawing is provided. Other objects, advantages, and capabilities of the present invention will become more apparent as the description proceeds, taken in conjunction with the accompanying drawings.

FIG. 6A is a top view partially showing an inspection stage corresponding to a wafer measuring 200 mm in diameter; FIGS. 6B and 6C illustrate states of the chuck top shown in FIG. 6A when used for a wafer measuring 300 mm in diameter.

DETAILED DESCRIPTION OF THE INVENTION

Figure 1:
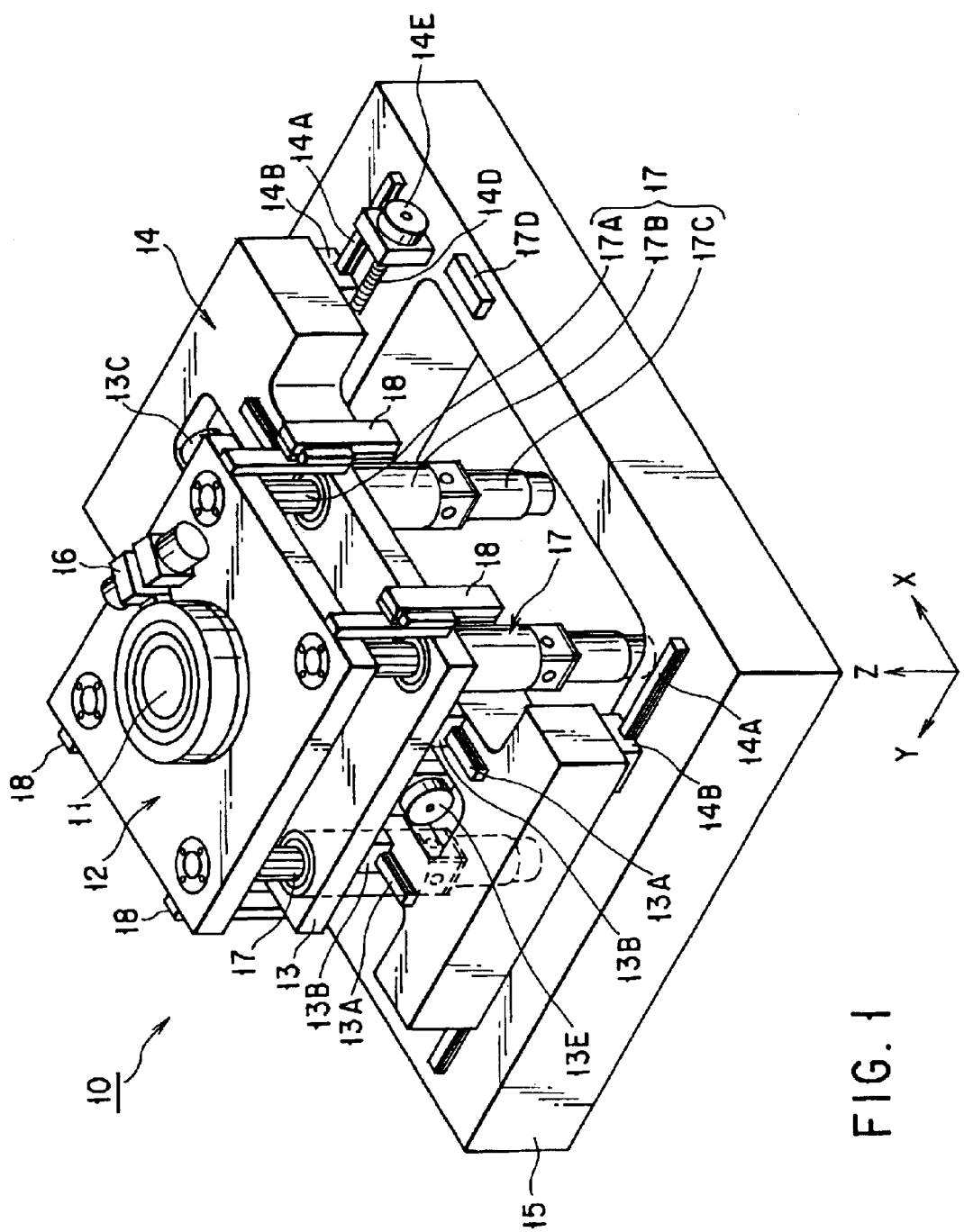
FIG. 1 is a perspective view showing an embodiment of an inspection stage of the present invention.

The following describes the present invention based on embodiments thereof as shown in FIGS. 1 to 4. For ease of explanation, the following description deals with the case where the work to be tested is an IC chip formed on a wafer. The present invention is not limited to this case and is broadly applicable to inspection stages for other works to be tested. As shown in FIG. 1, an inspection stage 10 according to this embodiment comprises a rectangular chuck top 11, a support (Z base) 12, an X stage 13, a Y stage 14, and a base 15. The chuck top 11 is used for mounting a wafer as a work to be tested. The Z base 12 is provided with the chuck top 11 and is movable vertically. The X stage 13 holds the Z base 12 by allowing vertical movement and moves in the X direction. The Y stage 14 holds the X stage 13 by allowing movement in the X direction and moves in the Y direction. The base 15 holds the Y stage 14 by allowing movement in the Y direction. Though it is desirable for the X and Y directions to cross at right angles, these directions can be specified at any angle.

A pair of locking blocks 13B are mounted on the rear of the X stage 13. Each of the locking blocks 13B engages with a pair of X guide rails 13A provided on the Y stage 14. A pair of locking blocks 14B is mounted on the rear of the Y stage 14. Each of the locking blocks 14B engages with a pair of Y guide rails 14A provided on the base 15. The X stage 13 is fixed with a ball screw (not shown) connected to a motor 13C. The motor 13C reciprocally moves the X stage 13 along the X guide rail 13A. The Y stage 14 is fixed with a ball screw 14D connected to a motor (not shown). This motor (not shown) reciprocally moves the Y stage 14 along the Y guide rail 14A. A sensor is provided for detecting movement amounts of the X stage 13 and the Y stage 14. Encoders 13E and 14E can be used as sensors. Based on a detection result of these sensors, a controller 17D controls movement amounts of the X stage 13 and the Y stage 14. A θ drive mechanism 16 is provided on the Z base 12. The θ drive mechanism 16 reversely rotates the chuck top 11 in the θ direction.

A support elevating mechanism vertically moves the Z base. As the support elevating mechanism, it is possible to use four Z axis elevating mechanisms 17 provided at four corners of the Z base 12 and an elevating position controller 17D. Each Z axis elevating mechanism 17 supports the Z base 12 elevatingly and holds it horizontally. Each Z axis elevating mechanism 17 is provided with a ball screw (Z axis) 17A hanging from a corner of the Z base 12, a nut member (Z axis guide) 17B hanging from the X stage 13, and a motor 17C. The Z axis 17A is screwed to the Z axis guide 17B. The motor 17C reversely rotates the Z axis 17A to raise the Z base 12 with reference to the X stage 13. Each Z axis elevating mechanism 17 is arranged outside the chuck top 11. A needle load applied to the chuck top 11 is dispersed to the four Z axis elevating mechanisms 17, reducing the rigidity of each Z axis guide 17B. In this embodiment, the Z base 12 is formed in a rectangle. The Z axis elevating mechanisms 17 are attached to the four corners of the Z base, minimizing the space necessary for the Z base 12. In addition, the chuck top 11 does not protrude from the Z base 12 and is placed therein.

Figure 2:
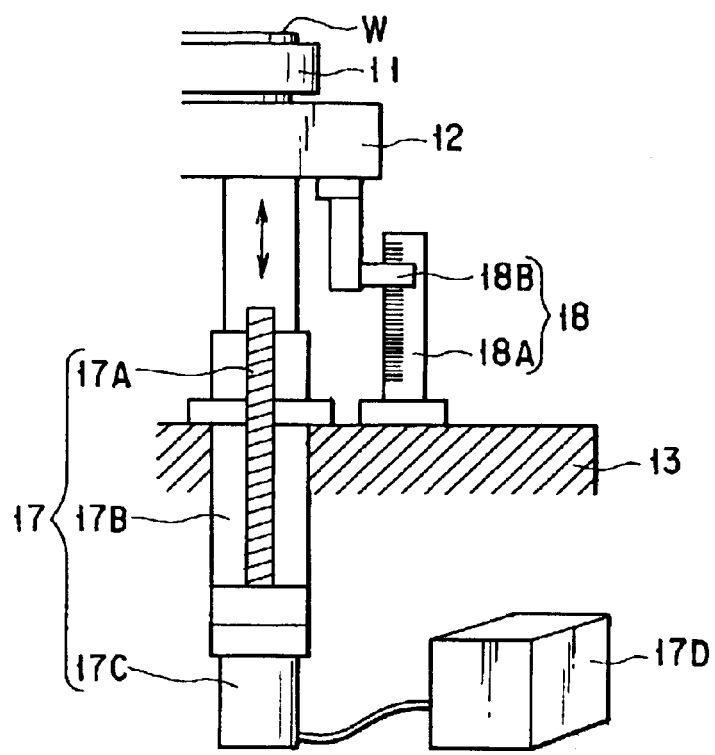
FIG. 2 is a schematic diagram showing a linear sensor of the inspection stage as shown in FIG. 1.

As shown in FIG. 2, a position controller 18 and an elevating position controller 17D are mounted at four corners of the Z base 12. This position controller can be a linear sensor 18. A detection result from these linear sensors 18 is used for accurately controlling a vertical position of the Z base 12 according to four Z axis elevating mechanisms 17. The linear sensor 18 will be described in further detail below with reference to the schematic diagram in FIG. 2.

As shown in FIG. 2, the linear sensor 18 is provided adjacent to the Z axis elevating mechanism 17 on the X stage 13. The linear sensor 18 comprises a linear sensor section 18A, a linear encoder section 18B. The linear encoder section 18B detects a scale on the linear sensor section 18A. As shown in FIG. 2, the linear encoder section 18B can be suspended from the Z base 12. The elevating position controller 17D compares the value detected by the linear encoder section 18B with the predetermined target position. This target position is determined by adding an overdrive amount for the Z base to a height of the needle tip on the probe card. Based on this difference, the elevating position controller 17D controls the motor 17C of the Z axis elevating mechanism 17 to set the Z base 12 to a specified position. A load during overdrive may cause an unbalanced load to depress the Z axis 17A of the Z axis elevating mechanism 17. In this case, the linear sensor 18 detects a depression amount. The motor 17C raises the Z base 12 for this depression amount. This ensures an optimal overdrive amount, permitting a reliable electric contact between the IC chip electrode pad and each probe.

Figure 3:
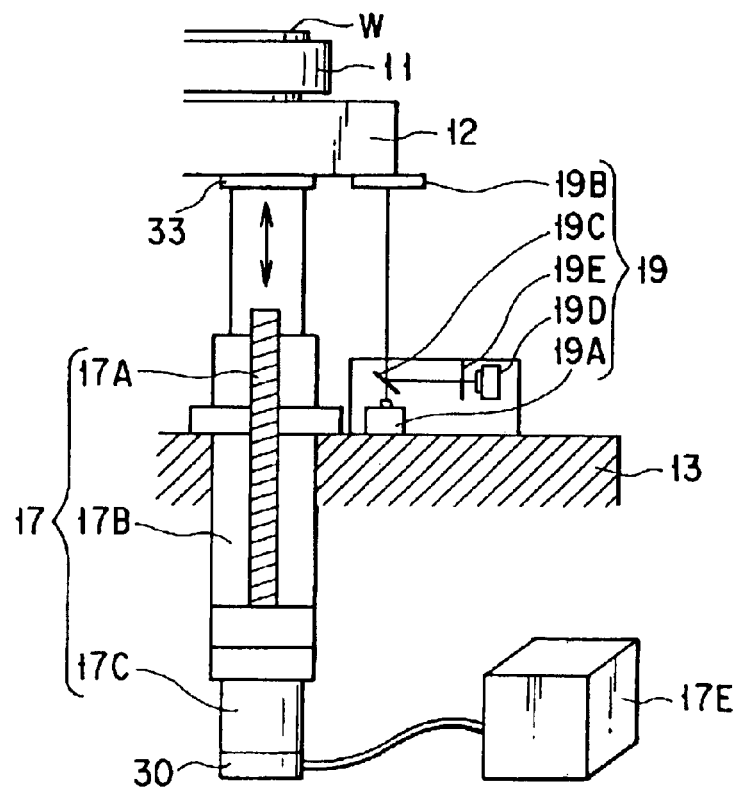
FIG. 3 is a schematic diagram showing a slant detection mechanism used for the inspection stage as shown in FIG. 1.

Each Z axis elevating mechanism can be provided with a rotary encoder 30 instead of the linear sensor 26 as the position controller. The rotary encoder 30 can detect a movement amount of the Z axis 25A but cannot detect a height of the Z base 20 with reference to the X stage 19. If the Z axis 25A is subject to depression, for example, it is impossible to keep track of an original position of the Z base 20. As a countermeasure, a load sensor such as a load cell can be provided between the Z axis 25A and the Z base 20 on the Z axis elevating mechanism 25 as shown in FIG. 3. The load sensor 33 is used to acquire the needle load and displacement amount data for the Z axis elevating mechanism 25. Based on this data, it is possible to compute a depression amount for the entire area of the chuck top 21. The computed value is used for correcting positions. This technique can control the position of the Z base 20 with an error of several meters or less.

Near one Z axis elevating mechanism 17, a slant detection mechanism 19 can be provided to detecting a slant of the Z base 12 as shown in FIG. 3. The slant detection mechanism 19 detects an abnormal slant of the Z base 12. Based on a detection result, a slant controller 17E controls the slant of the Z base 12. This control prevents an excess load from being applied to a Z axis guide 25B. The slant detection mechanism 19 can comprise a light emitting element 19A, a mirror 19B, a half mirror 19C, a photosensitive sensor 19D, and an aperture 19E. The light emitting element 19A is provided on the X stage 13. The mirror 19B is provided on the Z base 12 in such a manner as to face the light emitting element 19A. The half mirror 19C is provided between the mirror 19B and the light emitting element 19A slantwise at an angle of 45°. The photosensitive sensor 19D is provided to the side of the half mirror 19C. The aperture 19E is provided just in front of the photosensitive sensor 19D. Light from the light emitting element 19A passes the half mirror 19C and is reflected on the mirror 19B. The light reflected is further reflected on the half mirror 19C, passes through the aperture 19E, and is detected by the photosensitive sensor 19D. For example, this slant detection mechanism 19 can detect a slant of up to 0.5° for the Z base 12. If the Z base slants furthermore, the photosensitive sensor 19D cannot receive light. The photosensitive sensor 19D reports this state as an abnormal slant. Based on this report, the controller 17D corrects the Z base's slant.

The following describes operations. The inspection stage 10 receives one wafer W transported from a loader chamber. An alignment mechanism (not shown) moves the X and Y stages 13 and 14 in the X and Y directions, respectively. The θ drive mechanism 16 rotates the chuck top 11 in the θ direction. These operations control alignment between the IC chip electrode pad on the wafer W and each probe of the probe card. After the alignment is complete, IC chip's electric characteristics are inspected each time the wafer W is indexed.

During the inspection, the motors 17C for the four Z axis elevating mechanisms 17 are driven to raise the Z axes 17A along the Z axis guides 17B, thus contacting the wafer W with probes on the probe card. The motor 17C further raises the Z axis 17A to overdrive the wafer W, applying a large needle load to the wafer W.

According to this embodiment, the Z base 12 is elevatingly supported at four locations outside the chuck top 11. If a needle load is applied to the wafer W, it is possible to greatly decrease an inclination of the Z base 12 (or the chuck top 11) compared to the prior art. The needle load is dispersed to the four Z axis elevating mechanisms 17, decreasing a load to each Z axis elevating mechanism 17. This also decreases a load to the Z axis guide 17B from the Z axis 17A.

When an unbalanced load is applied to the wafer W, the nearest Z axis guide 17B is affected by an unbalanced load greater than any other portions. In this case, a depression amount of the Z axis 17A for that portion becomes greater than the other portions. Accordingly, the Z base 12 slants to impair the Z base's levelness.

In this embodiment, the linear sensor 18 monitors vertical positions of the four Z axis elevating mechanisms 17. Based on this monitoring result, the Z base 12 position is controlled to maintain its levelness. If the Z axis 17A of each Z axis elevating mechanism 17 is depressed from a target height, each linear sensor 18 detects the corresponding depression amount. Under the control based on the detected values, each motor 17C is automatically driven to raise each Z axis 17A by the depression amount. The Z base 12 or the chuck top 11 is raised to the original detection position. This ensures a necessary overdrive amount, providing a reliable electrical contact between the wafer W and probes on the probe card. If an unbalanced load causes different depression amounts for the four Z axis elevating mechanisms 17, the linear sensor 18 controls each Z axis elevating mechanism 17 according to the respective depression amount. The Z base 12 is raised at each location to a specified inspection position, ensuring a correct overdrive amount for the chuck top 11 and maintaining its levelness. The wafer W can securely contact all probes of the probe card, implementing inspection with high reliability.

At this time, the Z base 12 slants if the Z axis 17A of one Z axis elevating mechanism 17 is depressed for some reason. When this slant angle exceeds 0.5°, the slant detection mechanism 19 detects this state and notifies a slant error. This notification is used for preventing the Z axis guide 17B of the Z axis elevating mechanism 17 from being damaged.

As mentioned above, this embodiment minimizes the space necessary for the Z base 12 because the Z axis elevating mechanisms 17 are mounted at four corners of the rectangular Z base 12. The chuck top 11 can be placed inside the Z base 12 without sticking out. If the wafer X becomes larger, the Z base 12 and the inspection stage 10 need not be larger. Each Z axis elevating mechanism 17 elevatingly supports the Z base 12 from outside the chuck top 11. Accordingly, a slant for the chuck top 11 can be remarkably decreased if an unbalanced load is applied to the wafer W. A needle load is dispersed to four Z axis elevating mechanisms 17, decreasing a load to each Z axis elevating mechanism 17. This also decreases a load to the Z axis guide 17B from the Z axis 17A. The Z axis guide 17B can be structured with less rigidity.

This embodiment provides the linear sensor 8 for controlling vertical positions of the Z base 12 corresponding to the Z axis elevating mechanism 17. This can perform position control in accordance with a depression amount for the Z axis elevating mechanism 17, allowing a stable electrical contact between the wafer W and the probe card and providing highly reliable inspection.

In this embodiment, the slant detection mechanism 19 is provided for detecting levelness of the Z base 12. This solves the problem that the Z base 12 slants when one Z axis elevating mechanism 17 is given a load larger than that for the other mechanisms. The slant detection mechanism 19 notifies a slant error of the Z base 12 for preventing the Z axis elevating mechanism 17 from being damaged.

Figure 4A:
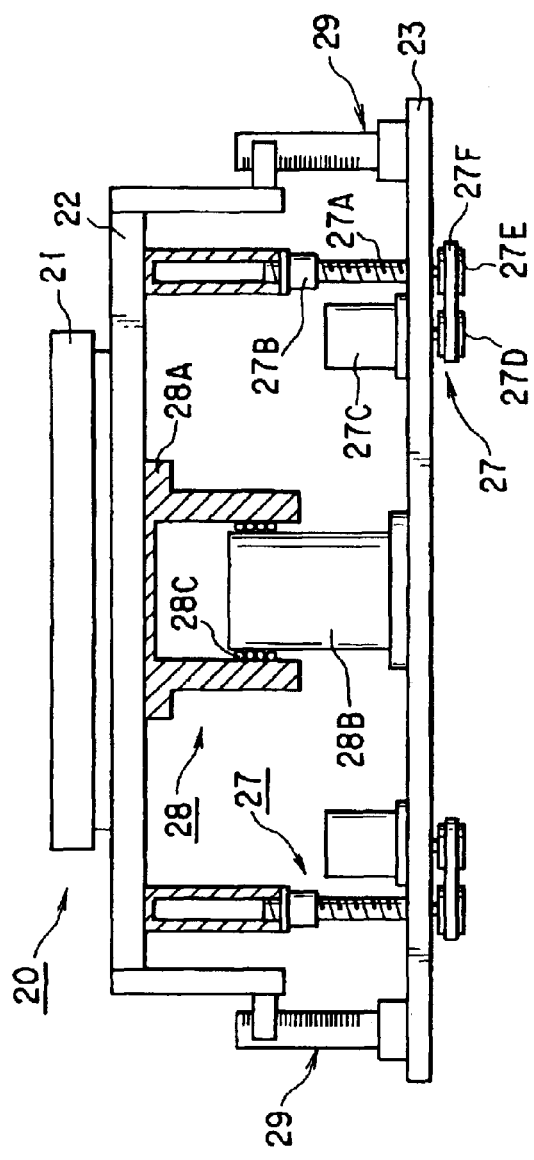
FIGS. 4A and 4B are side views partially showing sections of other embodiments of the inspection stage according to the present invention.
Figure 4B:
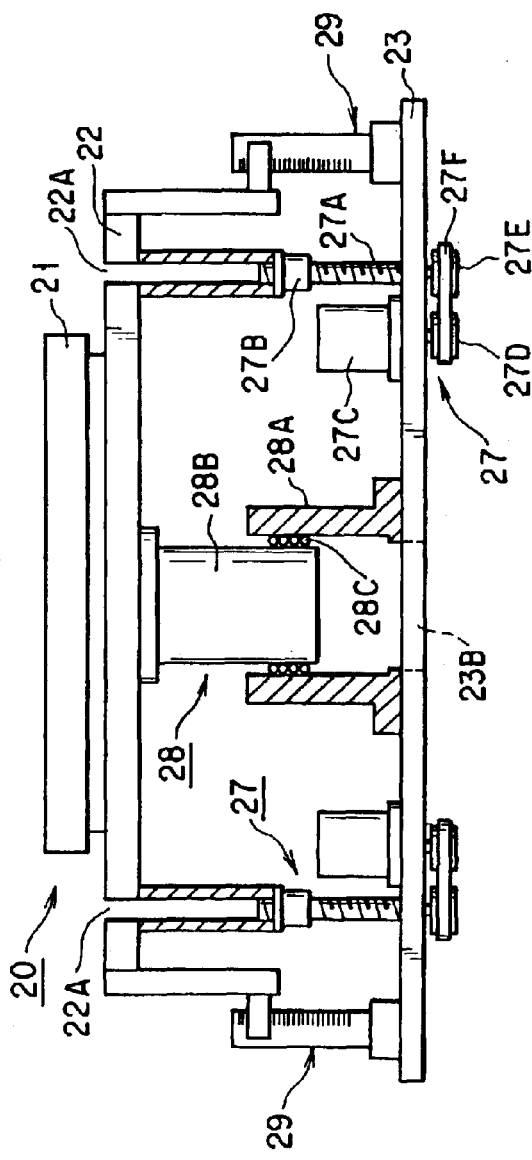
Figure 5:
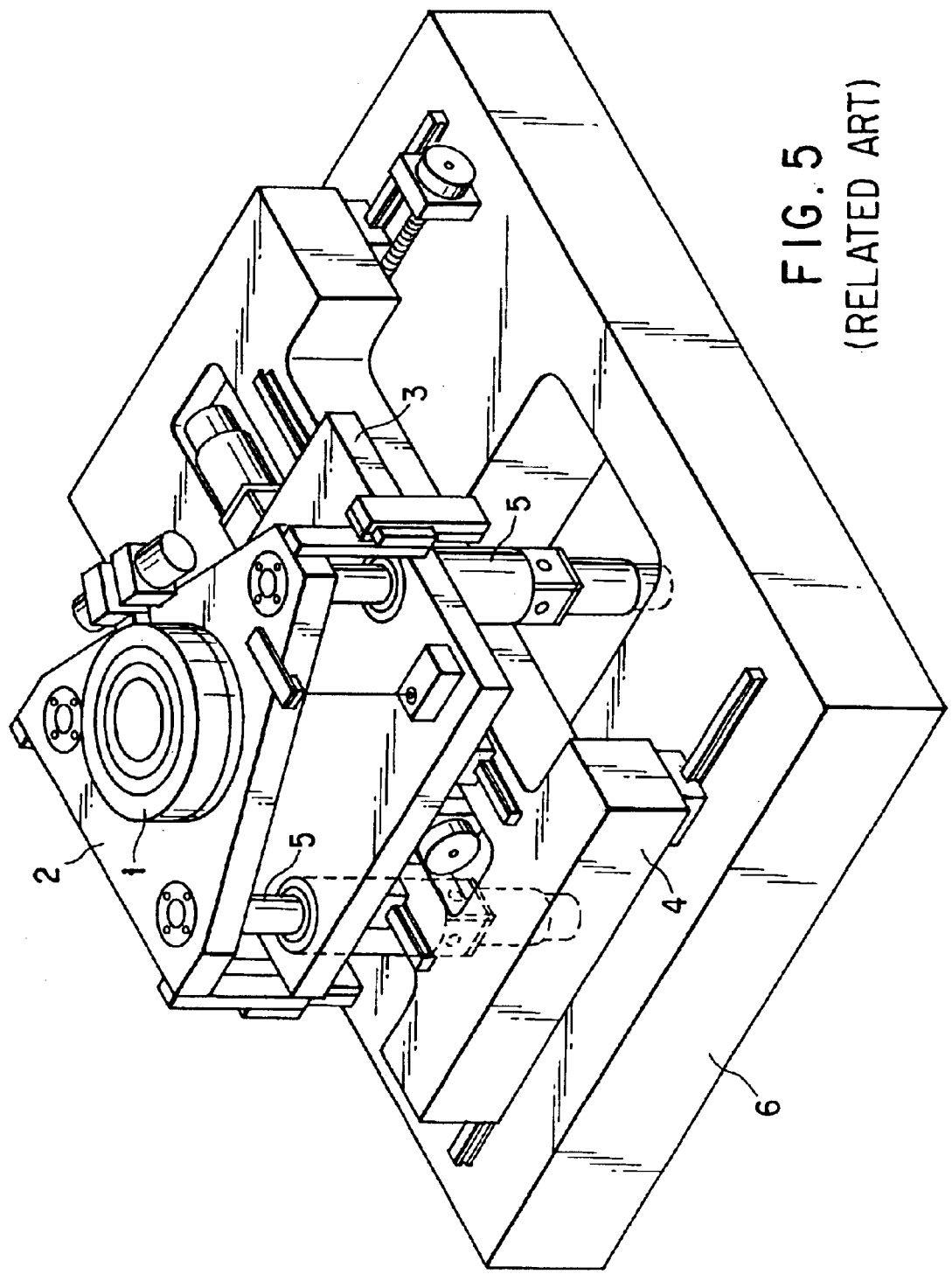
FIG. 5 is a perspective view showing a related inspection stage invented by the applicant.
Figure 6A:
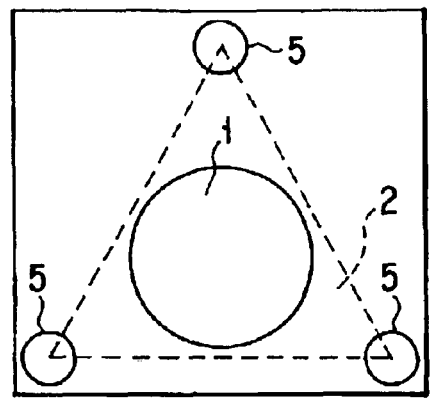
FIGS. 6A to 6C illustrate the problems to be solved by the present invention.
Figure 6B:
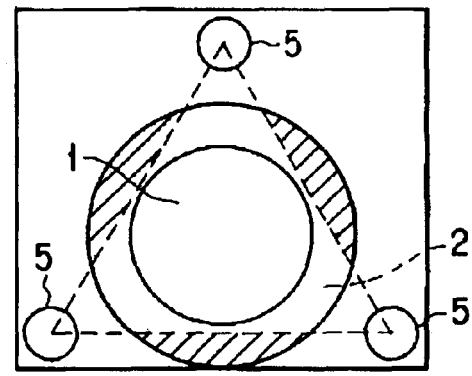
Figure 6C:
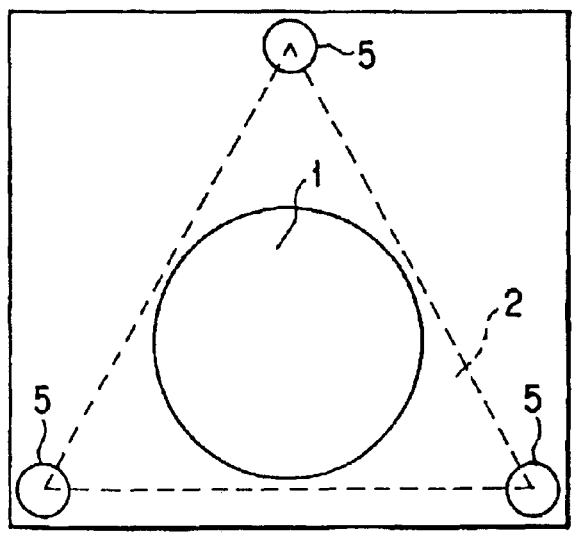

FIGS. 4A and 4B show other embodiments of the present invention. An inspection stage 20 in FIG. 4A according to this embodiment comprises a chuck top 21, a Z base 22, an X stage 23, and a Z axis guide 28. A wafer is placed on the chuck top 21. The chuck top 21 is provided on the elevating rectangular Z base 22. The X stage 23 elevatingly supports the Z base 22 and is movable in the X direction. The Z axis guide 28 is provided between the Z base and the X stage. It is desirable to form the chuck top 21 to be cylindrical or disk-shaped.

Basically, this embodiment is configured according to the embodiment shown in FIG. 1 except that the Z axis elevating mechanism 27 has a different structure and the Z axis guide 28 is provided. FIGS. 4A and 4B do not illustrate the structure below the Y stage. The Z axis elevating mechanism 27 used for this embodiment comprises a ball screw 27A, a nut 27B, and a motor 27C. The ball screw 27A bores through a corner corresponding to the X stage 23. The nut 27B is fit to the ball screw 27A. The motor 27C raises the Z base 22 with reference to the X stage 23 by reversely rotating the ball screw 27A inside the nut 27B. The motor 27C can be provided on the X stage 23. A rotating shaft of the motor 27C bores through the X sage 23 downward. A pulley 27D is fixed to the tip of this rotating shaft. The ball screw 27A is rotatively supported on the X stage 23 by means of a sliding member such as a ball bearing. A pulley 23E is fixed to the bottom end of the ball screw 27A.

The Z axis guide 28 comprises a cylinder 28A, a column 28B, and a sliding member 28C such as a bearing. The cylinder 28A is provided below the Z base. The column 28B is provided on the X stage. The sliding member 28C is provided between the column 28B and the cylinder 28A so that they can reciprocate smoothly. The cylinder 28A can be a circular cylinder or any other shape. Corresponding to the shape of the cylinder 28A, the column 28B can also be a circular column or any other shape. It is desirable to place the Z axis guide 28 at the center of each Z axis elevating mechanism 27.

An endless belt 27F can be used for coupling the pulley 27D to the motor 27C with the pulley 27E to the ball screw 27A. The motor 27C is provided on the X stage in FIG. 4A. However, it is possible to directly couple the motor 27C with the bottom end of the ball screw 27A.

Like the above-mentioned embodiment, each Z axis elevating mechanism 27 is provided outside the chuck top 11.

Accordingly, also in this embodiment, the Z axis elevating mechanisms 27 are attached to four corners of the rectangular Z base 22, minimizing the space necessary for the Z base 22. The chuck top 11 does not stick out from the Z base 12 and is placed therein. In FIG. 4, reference numeral 29 denotes a linear sensor.

FIG. 4B shows yet another embodiment of the present invention. Basically, FIG. 4B shows the same configuration as that in FIG. 4A. However, the cylinder 28A and the column 28B differ from the inspection stage of FIG. 4A in that (a) the cylinder and the column are arranged upside down, (b) the Z base is provided with an opening 22A for the ball screw 27A to bore, and (c) the X stage is provided with an opening 23B for the column 28B to bore.

The inspection stage in FIG. 4B can be of a small-size because it is possible to decrease the distance between the Z base 22 and the X stage 23 according to the above-mentioned features (a), (b), and (c).

The present invention is not limited to the above-mentioned embodiments and the design of each constituent element may be changed as required. For example, the inspection stage is widely applicable not only to the wafer prober, but also to stages used for an inspection which causes a load to a work to be tested.

The present invention obviates the need for enlarging the inspection stage for a large work to be tested. The present invention can remarkably decrease a slant on the chuck top. The present invention can also ensure inspection reliability.

The present invention includes means for controlling vertical positions of the support. If an unbalanced load causes the support to be depressed unevenly during inspection, it is possible to control the Z substrate position in accordance with the depression amount and always maintain the chuck top in a level position.

The present invention includes means for detecting the support horizontality. Accordingly, it is possible to detect an abnormal slant of the support due to an unbalanced load during inspection and prevent the elevating mechanism from being damaged.

It will be obvious to those skilled in the art that further features may be added and modifications made. Accordingly, the present invention is not limited to the specific details and particular embodiments disclosed herein. Therefore, it is to be understood that changes and variations may be made without departing from the spirit or scope of the following claims.

What is claimed is:

1. An inspection stage comprising:
   a chuck top on which a work to be tested is mounted, the chuck top including a support;
   at least four Z axes configured to support the support; and
   an elevating mechanism configured to vertically drive the support.

2. The inspection stage according to claim 1, wherein said elevating mechanism vertically moves the four axes independently of one another.

3. The inspection stage according to claim 1, wherein the work mounted on the chuck top is located inside a region defined by lines connecting said at least four axes to each other.

4. The inspection stage according to claim 2, wherein the elevating mechanism includes a vertical position control unit configured to control vertical positions of the Z axes independently of one another.

5. The inspection stage according to claim 4, wherein the vertical position control unit includes:
   a tilt detecting mechanism configured to detect a tilt of the support; and
   a tilt control unit configured to adjust the vertical positions of the Z axes based on a tilt of the support detected by the tilt detecting mechanism, and to control the tilt of the support to be within a predetermined range.

6. The inspection stage according to claim 1, further comprising a Z axis guide mechanism provided on a lower surface of the support and configured to guide the support when the support moves in a Z direction.

7. An inspection stage comprising:
   a chuck top on which a work to be tested is mounted, the chuck top including a support;
   at least four Z axes configured to support the support;
   an elevating mechanism configured to vertically drive the support; and
   an X-Y stage on which the elevating mechanism is mounted and which is movable in both an X direction and a Y direction.

* * * * *